United States Patent
Schwamb

(10) Patent No.: US 10,014,488 B2
(45) Date of Patent: Jul. 3, 2018

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventor: Philipp Schwamb, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/126,602

(22) PCT Filed: Mar. 10, 2015

(86) PCT No.: PCT/EP2015/054933
§ 371 (c)(1),
(2) Date: Sep. 16, 2016

(87) PCT Pub. No.: WO2015/140004
PCT Pub. Date: Sep. 24, 2015

(65) Prior Publication Data
US 2017/0084859 A1 Mar. 23, 2017

(30) Foreign Application Priority Data
Mar. 19, 2014 (DE) .................. 10 2014 103 747

(51) Int. Cl.
*H01L 51/52* (2006.01)
*H01L 51/00* (2006.01)
*H01L 51/56* (2006.01)

(52) U.S. Cl.
CPC ...... *H01L 51/5203* (2013.01); *H01L 51/0021* (2013.01); *H01L 51/5212* (2013.01);
(Continued)

(58) Field of Classification Search
None
See application file for complete search history.

(56) References Cited

U.S. PATENT DOCUMENTS 9,196,866 B2 * 11/2015 Schlenker .......... H01L 51/525
2006/0158095 A1 * 7/2006 Imamura .......... H01L 27/3279
313/500
(Continued)

FOREIGN PATENT DOCUMENTS

CN 102971882 A 3/2013
DE 102006033713 A1 12/2007
(Continued)

OTHER PUBLICATIONS

International Search Report based on Application No. PCT/EP2015/054933 (4 Pages and 3 Pages of English translation) dated Jul. 10, 2015 (Reference Purpose Only).
(Continued)

*Primary Examiner* — Benjamin Sandvik
(74) *Attorney, Agent, or Firm* — Viering Jentschura & Partner MBB

(57) ABSTRACT

An optoelectronic component may include a carrier, above which a first electrode is formed. An optically functional layer structure is formed above the first electrode. A second electrode is formed above the optically functional layer structure, the second electrode extending areally over at least one part of the side of the optically functional layer structure which faces away from the carrier. An encapsulation is formed above the first and/or second electrode, the encapsulation encapsulating the optically functional layer structure. An electrically conductive contact structure is arranged in a cutout of the encapsulation on the first and/or second electrode and extends through the encapsulation, for electrically contacting the first and/or second electrode. The contact structure and the encapsulation are formed such that in interaction they encapsulate the first and/or second electrode.

6 Claims, 7 Drawing Sheets

(52) U.S. Cl.
CPC .......... *H01L 51/5253* (2013.01); *H01L 51/56* (2013.01); *H01L 2251/5361* (2013.01)

(56) References Cited

U.S. PATENT DOCUMENTS

| | | |
|---|---|---|
| 2008/0042558 A1 | 2/2008 | Buchhauser et al. |
| 2012/0156813 A1* | 6/2012 | Kim .................... H01L 51/5246 438/27 |
| 2012/0211775 A1* | 8/2012 | Hosoya ............... H01L 27/3202 257/88 |
| 2014/0097427 A1* | 4/2014 | Nakamura .......... H01L 27/3288 257/40 |
| 2014/0284590 A1* | 9/2014 | Nakazawa ............. G02B 5/201 257/40 |
| 2015/0021571 A1* | 1/2015 | Yamakita ............ H01L 51/5228 257/40 |

FOREIGN PATENT DOCUMENTS

| | | |
|---|---|---|
| DE | 102011005612 A1 | 9/2012 |
| EP | 2363905 A1 | 9/2011 |
| JP | H0982476 A | 3/1997 |
| WO | 2007036850 A2 | 4/2007 |
| WO | 2010136963 A1 | 12/2010 |
| WO | 2011108921 A1 | 9/2011 |

OTHER PUBLICATIONS

German Search Report based on Application No. 10 2014 103 747.2(7 Pages) dated Feb. 20, 2015 (Reference Purpose Only).
Chinese Office Action based on Application No. 201580014698.5 (7 pages and 5 pages of English translation) dated Aug. 28, 2017 (Reference Purpose Only).

* cited by examiner

FIG 1 <Prior art>
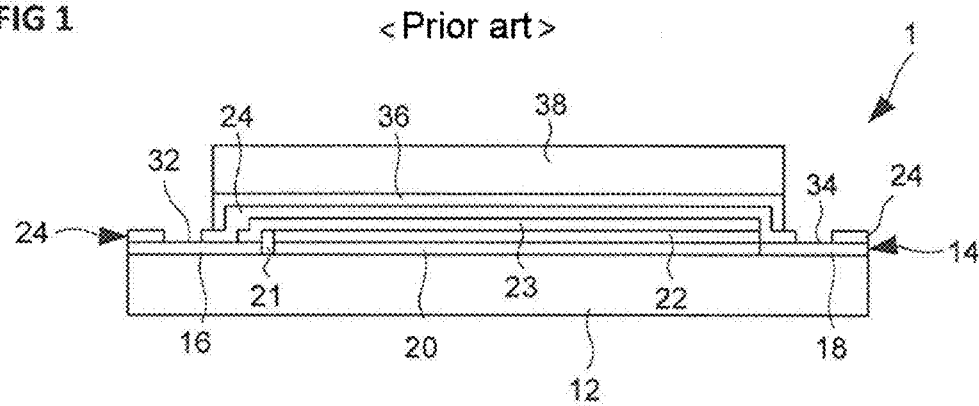
FIG 2
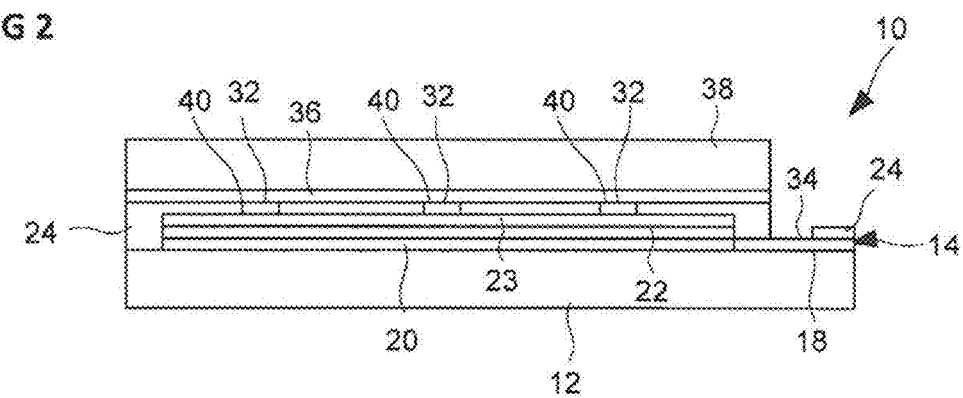
FIG 3
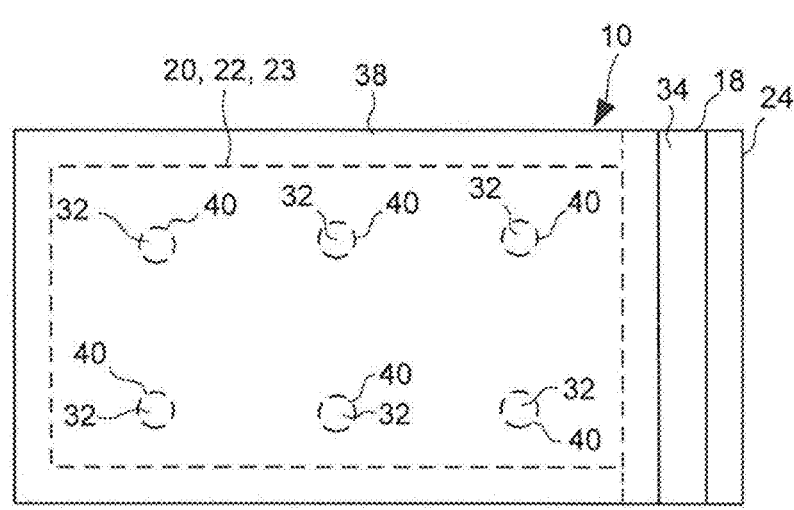

OPTOELECTRONIC COMPONENT AND METHOD FOR PRODUCING AN OPTOELECTRONIC COMPONENT

RELATED APPLICATIONS

The present application is a national stage entry according to 35 U.S.C. § 371 of PCT application No.: PCT/EP2015/054933 filed on Mar. 10, 2015, which claims priority from German application No.: 10 2014 103 747.2 filed on Mar. 19, 2014, and is incorporated herein by reference in its entirety.

TECHNICAL FIELD

Various embodiments relate to an optoelectronic component and a method for producing an optoelectronic component.

BACKGROUND

Conventional optoelectronic components, for example OLEDs, are usually constructed from a substrate, optically functional layers, for example organic functional layers, electrode layers, an encapsulation layer, for example a thin-film encapsulation layer (TFE), against action of moisture, and a covering body, for example a cover plate. In many cases, a heat sink and/or a heat spreader, for example a metal plate or a metal film, are/is also laminated onto the cover glass. The cover plate serves as mechanical protection and as a further moisture barrier and, like the substrate, generally consists of solid glass. The cover glass is usually laminated onto the substrate over the whole area in the context of the production process. The encapsulation layer is formed between the cover plate and the substrate and generally extends over the entire substrate.

During the production process, a plurality of optoelectronic components are produced in the component assemblage and are subsequently singulated, for example by means of scribing and breaking the substrate and the cover plate. In the component assemblage, the substrate and the cover plate extend in each case integrally over a plurality of optoelectronic components. The scribing and breaking can be effected in such a way that electrical contacts for electrically contacting the electrode layers are exposed in the process or at least only the encapsulation layer and/or diverse intermediate layers, such as an adhesive layer, for example, have to be removed in order that the electrical contacts are at least partly exposed and thus electrically contactable. A mechanical, environmentally resistant electrical contacting of the electrical contacts can be difficult, for example if the contact regions are mechanically sensitive. Furthermore, the electrical contacting that necessitates locally damaging the encapsulation layer can impair the effect thereof, since it is no longer closed areally and contaminants can possibly penetrate between the encapsulation layer and the electrical contact. Such contaminants can then advance as far as the optically functional layers and damage the latter.

Therefore, it is possible to form the electrical contacts, for example of OLEDs or of organic solar cells, for example in an edge region of the corresponding optoelectronic component, for example alongside an optically active and/or functional region and/or at a spur of the electrode to be contacted, and to electrically contact them there. A relatively high mechanical and/or thermal loading can be employed in this region since no sensitive layers, for example organic functional layers, are situated underneath. In the edge region, furthermore, the electrical contacts can be reinforced, for example made particularly thick, since the requirements made of the electrical contact in the edge region may be different in comparison with the electrode in the active region. By way of example, a lower transparency may be acceptable in the edge region. Moreover, the mechanical sensitivity may be reduced, for example because a mechanical damage to the electrical contact may have fewer effects on the operation of the optoelectronic component than a mechanical damage to the electrode in the active region, for example if no optically functional layers are arranged below the electrical contact in the edge region.

However, an electrical contacting exclusively in the edge region can lead to disadvantages in the current distribution in the optoelectronic component, which may require the arrangement of electrically conductive intermediate lines, such as busbars, for example. Furthermore, the electrical contacting exclusively in the edge region requires a structured arrangement of the optically functional layer structures and the electrodes.

SUMMARY

In various embodiments, an optoelectronic component is provided which is producible in a simple manner and/or electrically contactable in a simple manner and/or in which a uniform current distribution in the optoelectronic component is possible in a simple manner during operation.

In various embodiments, a method for producing an optoelectronic component is provided which can be carried out in a simple manner and/or which can contribute to the fact that, in the optoelectronic component, a uniform current distribution in the optoelectronic component is possible in a simple manner during operation.

In various embodiments, an optoelectronic component is provided. The optoelectronic component includes a carrier. A first electrode is formed above the carrier. An optically functional layer structure is formed above the first electrode. A second electrode is formed above the optically functional layer structure, said second electrode extending areally over at least one part of the side of the optically functional layer structure which faces away from the carrier. An encapsulation is formed above the second electrode, said encapsulation encapsulating the optically functional layer structure. For electrically contacting the first and/or second electrode, an electrically conductive contact structure is arranged in a cutout of the encapsulation on the first and/or second electrode and extends through the encapsulation layer. The contact structure and the encapsulation are formed such that in interaction they encapsulate the first and/or second electrode.

If the contact structure is formed on the first and second electrodes, then a first contact structure is formed on the first electrode and a further, for example a second, contact structure is formed on the second electrode. The contact structure enables a simple electrical contacting of the corresponding electrode. The contact structure can be formed by one or a plurality of electrically conductive contact elements applied locally to the corresponding electrode. By way of example, the contact element may include an electrically conductive paste, an electrically conductive adhesive and/or solder. The contact structure can be applied gently to the corresponding electrode, in particular such that the corresponding electrode and/or an underlying structure are/is not damaged. The contact structure can improve the mechanical stability of the corresponding electrode. This can contribute to the fact that the optoelectronic component is subsequently electrically contactable particularly simply and securely via the contact structure. Furthermore, the electrical contacting can also be effected above an optically active region of the optoelectronic component, for example above the optically functional layer structure, since the latter is protected during contacting by the contact structure.

Furthermore, mechanically sensitive locations of the optoelectronic component can be directly contacted (for example thin electrodes in the optically active region and/or thin contact regions on a thin insulation layer). The contact structure and, if appropriate, further contact structures can be arranged on the corresponding electrode in a manner distributed virtually freely, for example also in the active region of the optoelectronic component, such that voltage losses in the plane of the corresponding electrode can be reduced and/or the current distribution in the corresponding electrode can be fashioned more freely. This can contribute, for example, to obtaining a better homogeneity of luminous areas and/or a higher efficiency of the optoelectronic component. This can contribute to reducing a number and/or size of busbars for distributing the current or to being able to dispense with them completely. The increased freedom of design when arranging the contact structures enables the latter to be embodied with a small area, such that a large active or useful area per production area can arise. Furthermore, in a further contacting step, for example for electrically contacting the contact structure, mechanically or chemically loading processes can be used.

The fact that the contact structure and the encapsulation in interaction encapsulate the first and/or the second electrode can mean, for example, that the contact structure bears with direct physical contact closely against a wall of the cutout of the encapsulation, to be precise circumferentially against the entire wall, and that the contact structure itself forms a partial encapsulation. The contact structure and the encapsulation thus form a closed area above the first and/or second electrode and/or above the organic functional layer structure. In other words, the first and/or second electrode and/or the organic functional layer structure are/is completely covered by the encapsulation and the contact structure and/or protected thereby. Thus, although the contact structure forms an interruption of the encapsulation, in interaction with the encapsulation it protects the corresponding electrode and the underlying organic functional layers against the harmful environmental influences. For this reason, the material of the contact structure can be formed for example with an impermeability similar to or greater than that of the material of the encapsulation. In other words, the contact structure includes a material and has a material thickness such that the contact structure has the necessary encapsulation effect.

The encapsulation may include an encapsulation layer and/or a covering body. The encapsulation layer can be formed above, for example on, the second electrode. The covering body can serve as encapsulation as an alternative or in addition to the encapsulation layer. By way of example, the covering body and an adhesion medium layer for fixing the covering body can serve as encapsulation.

In various embodiments, the contact structure is formed at least partly between the encapsulation and the first and/or second electrode. In other words, the contact structure is formed at least partly below the encapsulation and/or is covered at least partly by the encapsulation. To put it in yet another way, the encapsulation at least partly overlaps the contact structure.

In various embodiments, the contact structure projects from the cutout of the encapsulation. By way of example, a thickness of the contact structure can be greater than a thickness of the encapsulation. In this context, the thickness can be measured in a direction perpendicular to a surface of the electrode on which the contact structure is formed.

In various embodiments, the contact structure includes one, two or more contact elements which are formed in each case in an electrically conductive fashion and which are in direct physical and electrical contact with one another at least in pairs. By way of example, the contact structure includes a first contact element and at least one second contact element arranged between the first contact element and the corresponding electrode. In this context, the first contact element can be for example a solid body, for example a solid metal body, and the second contact element can be for example an adhesion medium, for example an adhesive, for example a silver adhesive, a solder and/or a conductive paste, for example a silver paste. Furthermore, a third contact element can be arranged, for example, which projects through the encapsulation and electrically contacts the first contact element. The third contact element can be for example a needle-shaped contact element.

In various embodiments, the optoelectronic component includes a conductor track structure, which is formed above, below and/or between the encapsulation and which is electrically coupled to the contact structure. The conductor track structure may include for example one, two or more electrically conductive conductor tracks. The conductor track structure serves for electrically contacting the contact structure. The conductor track structure can be electrically coupled for example to an electronic circuit for the operation of the optoelectronic component. The fact that the conductor track structure is formed between the encapsulation can mean, for example, that the conductor track structure is formed between the encapsulation layer and the covering body. The fact that the conductor track structure is formed below the encapsulation can mean, for example, that the conductor track structure is formed below the covering body.

In various embodiments, the conductor track structure is arranged in an adhesion medium layer. The adhesion medium layer is formed above the second electrode. By way of example, by means of the adhesion medium layer, a covering body of the encapsulation can be fixed above the second electrode and/or, if appropriate, above the encapsulation layer.

In various embodiments, the optoelectronic component includes, above the first and/or second electrode, two, three or more of the contact structures, which are arranged in a distributed fashion above the corresponding electrode and which are formed in corresponding cutouts of the encapsulation. This can contribute to a particularly uniform current distribution in the optoelectronic component. This can contribute to a high efficiency of the optoelectronic component. In the case of an OLED, the uniform current distribution can contribute to a uniform brightness distribution.

In various embodiments, a method for producing an optoelectronic component is provided, wherein a carrier is provided. By way of example, the carrier is formed. A first electrode is formed above the carrier. An optically functional layer structure is formed above the first electrode. A second electrode is formed above the optically functional layer structure such that the second electrode extends areally over at least one part of the side of the optically functional layer structure which faces away from the carrier. At least one part of an electrically conductive contact structure is formed on the first and/or second electrode. An encapsulation is formed above the first and/or second electrode and the contact structure such that the encapsulation encapsulates the optically functional layer structure, the first and/or second electrode and the contact structure. The encapsulation is processed and/or the contact structure is formed such that the contact structure forms an electrically conductive connection to the first and/or second electrode through the encapsulation.

In various embodiments, the first and/or second electrode is encapsulated by the contact structure and the encapsulation in interaction.

In various embodiments, the encapsulation includes the encapsulation layer. The encapsulation layer is processed such that the contact structure forms the electrically conductive connection through the encapsulation layer by virtue of the contact structure being at least partly freed of the encapsulation layer. By way of example, the encapsulation layer can be removed above the contact structure, for example by means of a mechanical process, such as, for example, by means of scratching or grinding, or by means of a chemical process, for example by means of etching, or by means of laser ablation.

In various embodiments, the contact structure is formed such that the contact structure projects from the encapsulation layer after the contact structure has been freed of the encapsulation layer. Alternatively or additionally, the contact structure may include the first contact element and the second contact element, wherein the first contact element is coupled to the corresponding electrode via the second contact element. By way of example, the first contact element can be a solid body and the second contact element can be an adhesion medium, for example adhesive, conductive paste or solder.

In various embodiments, at least one part of the contact structure is formed on the first and/or second electrode by virtue of the first contact element of the contact structure being formed on the first and/or second electrode. The encapsulation is processed and/or the contact structure is formed such that the contact structure forms the electrically conductive connection through the encapsulation by virtue of a further contact element being moved through the encapsulation until the further contact element physically and electrically contacts the first contact element. The further contact element can be the third contact element, for example.

In various embodiments, a conductor track structure is formed above the encapsulation and is electrically coupled to the contact structure.

In various embodiments, above the electrode, two, three or more of the contact structures are arranged in a distributed fashion above the first and/or second electrode. The two, three or more contact structures can be formed for example in a manner corresponding to the contact structure explained above.

In various embodiments, a plurality of optoelectronic components are produced in the component assemblage, wherein the carrier extends over a plurality of the optoelectronic components, the optically functional layer structures, the electrodes, the contact structures and the encapsulation layers of the optoelectronic components are formed in the component assemblage and the optoelectronic components are subsequently singulated. Before or after the singulation of the optoelectronic components, the encapsulations can be processed and/or the contact structures can be formed such that the contact structures form the electrically conductive connections to the corresponding electrodes through the corresponding encapsulations.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a sectional illustration of a conventional optoelectronic component;

FIG. 2 shows a sectional illustration of one embodiment of an optoelectronic component;

FIG. 3 shows a plan view of one embodiment of an optoelectronic component;

DETAILED DESCRIPTION

Figure 4:
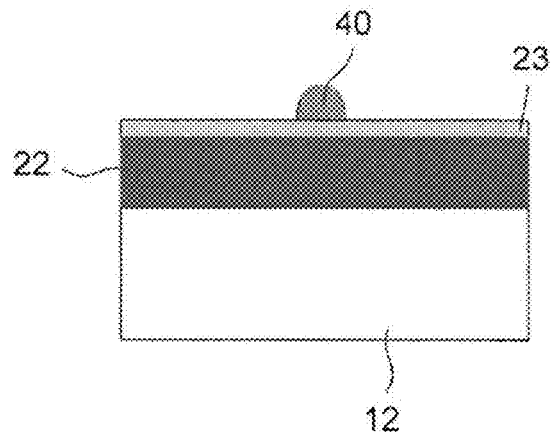
FIG. 4 shows a detailed sectional illustration of one embodiment of an optoelectronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be an electromagnetic radiation emitting component or an electromagnetic radiation absorbing component. An electromagnetic radiation absorbing component can be for example a solar cell. In various embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this connection, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

In various embodiments, the term "translucent" or "translucent layer" can be understood to mean that a layer is transmissive to light, for example to the light generated by a light emitting component, for example in one or a plurality of wavelength ranges, for example to light in a wavelength range of visible light (for example at least in one partial range of the wavelength range of 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of 380 nm to 780 nm), wherein light coupled into a structure (for example a layer) is also coupled out from the structure (for example layer) substantially without scattering or light conversion.

An electrically conductive connection can be for example a galvanic connection. An electrically conductive material can be for example a galvanic material.

FIG. 1 shows a conventional optoelectronic component 1. The conventional optoelectronic component 1 includes a carrier 12, for example a substrate. The carrier 12 can be formed as translucent or even transparent. An optoelectronic layer structure is formed on the carrier 12.

The optoelectronic layer structure includes a first electrode layer 14 including a first contact section 16, a second contact section 18 and a first electrode 20. The second contact section 18 is electrically coupled to the first electrode 20 of the optoelectronic layer structure. The first electrode 20 is electrically insulated from the first contact section 16 by means of an electrical insulation barrier 21. An optically functional layer structure 22, for example an organic functional layer structure, of the optoelectronic layer structure is formed above the first electrode 20. The optically functional layer structure 22 may include for example one, two or more partial layers, as explained in greater detail further below with reference to FIG. 15. A second electrode 23 of the optoelectronic layer structure is formed above the optically functional layer structure 22, said second electrode being electrically coupled to the first contact section 16. The first electrode 20 serves for example as an anode or cathode of the optoelectronic layer structure. In a manner corresponding to the first electrode, the second electrode 23 serves as a cathode or anode of the optoelectronic layer structure. The first contact section 16 can also be designated as a spur of the second electrode 23. An encapsulation layer 24 of the optoelectronic layer structure is formed above the second electrode 23 and partly above the first contact section 16 and partly above the second contact section 18, said encapsulation layer encapsulating the optoelectronic layer structure. In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion medium layer 36 is formed above the encapsulation layer 24. The adhesion medium layer 36 includes for example an adhesion medium, for example an adhesive, for example a lamination adhesive, a lacquer and/or a resin. A covering body 38 is formed above the adhesion medium layer 36. The adhesion medium layer 36 serves for fixing the covering body 38 to the encapsulation layer 24. The covering body 38 includes glass and/or metal, for example. The covering body 38 serves for protecting the conventional optoelectronic component 1, for example against external actions, for example against mechanical force actions from outside and/or against environmental influences such as moisture or oxygen. The covering body 38 serves for example as hermetic protection against moisture being introduced areally. This can mean, for example, that the covering body 38 can have for example a diffusion rate with respect to water and/or oxygen of less than 10-1 g/(m2d), for example less than 10-4 g/(m$^2$d), for example less than 10-10 g/(m$^2$d), for example up to approximately 10-6 g/(m$^2$d). Furthermore, the covering body 38 can serve for spreading and/or dissipating heat generated in the conventional optoelectronic component 1. By way of example, the glass of the covering body 38 can serve as protection against external actions and the metal layer of the covering body 38 can serve for spreading and/or dissipating the heat that arises during the operation of the conventional optoelectronic component 1. The covering body 38 and/or the encapsulation layer 24 can be designated as encapsulation of the conventional optoelectronic component 1. In particular, in the absence of the encapsulation layer 24, for example, the covering body 38 serves as encapsulation of the conventional optoelectronic component 1.

The adhesion medium layer 36 can be applied to the encapsulation layer 24 in a structured fashion, for example. The fact that the adhesion medium layer 36 is applied to the encapsulation layer 24 in a structured fashion can mean, for example, that the adhesion medium layer 36 already has a predefined structure directly upon application. By way of example, the adhesion medium layer 36 can be applied in a structured fashion by means of a dispensing or printing method.

The conventional optoelectronic component 1 is sensitive to external actions in the first contact region 32 and the second contact region 34, since no covering body 38 is provided in these contact regions 32, 34.

The conventional optoelectronic component 1 can be singulated from a component assemblage, for example, by the carrier 12 being scribed and then broken along its outer edges illustrated laterally in FIG. 1, and by the covering body 38 equally being scribed and then broken along its lateral outer edges illustrated in FIG. 1. The encapsulation layer 24 above the contact regions 32, 34 is exposed during this scribing and breaking. Afterward, the first contact region 32 and the second contact region 34 can be exposed in a further method step, for example by means of an ablation process, for example by means of laser ablation, mechanical scratching or an etching method.

FIG. 2 shows a sectional illustration of one embodiment of an optoelectronic component 10. The optoelectronic component 10 can for example largely correspond to the conventional optoelectronic component 1 explained above. In contrast thereto, the optoelectronic component 10 includes at least one contact structure 40, for example two or more contact structures 40, for example three contact structures 40. The encapsulation of the optoelectronic component 10 is formed by the encapsulation layer 24.

The contact structures 40 are formed with direct physical contact on the second electrode 23 of the optoelectronic component 10. The contact structures 40 include electrically conductive material and/or are formed from electrically conductive material. The contact structures 40 constitute an electrically conductive, for example galvanic, connection through the encapsulation layer 24 to the second electrode section 23. By way of example, the contact structures 40 extend through the encapsulation layer 24.

The contact structures 40 are formed at least partly in cutouts of the encapsulation. Alternatively or additionally, the contact structures 40 can be arranged at least partly below the encapsulation and/or between the encapsulation and the second electrode 23. The contact structures 40 and the encapsulation in interaction encapsulate the second electrode 23. This can mean, for example, that the contact structures 40 bear with direct physical contact closely against walls of the cutouts of the encapsulation, to be precise circumferentially against the entire walls, and that the contact structures 40 themselves form a partial encapsulation. The contact structures 40 and the encapsulation thus form a closed area above the second electrode 23 and above the organic functional layer structure 22. In other words, the second electrode 23 and the organic functional layer structure 22 are completely covered by the encapsulation and the contact structures 40 and/or protected thereby. Thus, although the contact structures 40 form an interruption of the encapsulation, in interaction with the encapsulation they protect the second electrode 23 and the underlying organic functional layer structure against harmful environmental influences. For this reason, the material of the contact structures 40 can be formed for example with an impermeability similar to or greater than that of the material of the encapsulation. In other words, the contact structures 40 include a material and have a material thickness such that the contact structures 40 have the necessary encapsulation effect.

The first contact regions 32 are formed on the contact structures 40. The second contact region 34 extends over the entire width of the optoelectronic component 10. However, the second contact region 34 can also extend only over a part of the optoelectronic component 10.

The electrically conductive material of the contact structures 40 may include for example silver, gold, platinum, nickel, tin, bismuth or copper, or an alloy including one or more of these materials. The contact structures 40 can be formed for example by a solder or a silver paste. The contact structures 40 can be formed for example by a thin-film metal structure. The contact structures 40 can be formed for example by contact points and/or contact strips.

A thickness of the contact structures 40 in a direction perpendicular to a surface of the second electrode 23 on which the contact structures 40 are arranged can be in a range for example of 1 μm to 10 mm, for example of 10 μm to 1 mm, for example of 100 μm to 500 μm. The thickness can for example be greater than a thickness of the encapsulation layer 24. The thickness of the contact structure 40 can for example be formed such that it is only slightly thicker than the thickness of the encapsulation layer 24. Alternatively or additionally, the thickness of the contact structure 40 can be formed such that it is for example 2 to 5 times, for example 3 to 4 times, thicker than the thickness of the encapsulation layer and/or of the second electrode 23.

A width or a diameter of the contact structure 40, for example in a direction parallel to the surface of the second electrode 23 on which the contact structure 40 is arranged, can be in a range for example of 0.005 mm to 10 mm, for example of 0.1 mm to 5 mm, for example approximately 2.5 mm. If the contact structures 40 are formed as contact strips, a length of the contact structures, for example in a direction parallel to the surface of the second electrode 23 on which the contact structure is arranged, and in a direction perpendicular to the width, can be for example in a range of from the width up to 1 m, for example up to 10 cm, for example up to 1 cm, for example up to 1 mm.

The contact structures 40 make it possible to electrically contact the second electrode 23 directly, in particular without the second contact section 18, to be precise through the encapsulation layer 24. This makes it possible to form the optoelectronic component 10 on a side of the optically functional layer structure 22 facing away from the first contact section 16 with only one cut surface, in particular such that a lateral outer edge of the covering body 38 is formed flush with a lateral outer edge of the carrier 12. This can contribute to forming the optoelectronic component 10 in a simple manner, since the optoelectronic component 10 can be cut and/or sawn at the corresponding side surface in a simple manner in a cutting and/or sawing process.

Furthermore, the stability of the optoelectronic component 10 increases in this region, since the covering body 38 and the carrier 12 mutually protect one another at the corresponding side, in a manner similar to the case centrally in the optoelectronic component 10. Furthermore, if the second contact section 18 is dispensed with, with a carrier 12 of the same size it is possible to use a larger area of the carrier 12 for applying the optoelectronic layer structure.

Alternatively or additionally, the contact structures 40 can be formed relatively stably compared with the second electrode 23 and/or the second contact section 18, for example such that an electrical contacting of the contact structures 40 is possible in a simple manner, without the underlying layers, in particular the second electrode 23 and/or the optically functional layer structure 22, being damaged in the process, for example on account of mechanical action, for example on account of scratching.

Furthermore, by arranging a plurality of the contact structures 40 alongside one another, it is possible to achieve a good and/or uniform current distribution via the second electrode 23 and over the surface of the optically functional layer structure 22. As a result, during the operation of the optoelectronic component 10, an optical appearance can be particularly uniform and/or an effectiveness of the optoelectronic component 10 can be particularly good and/or the appearance can be set such that it has bright regions and dark regions relative thereto and/or brightness gradients. By way of example, different voltages and/or potentials can be applied to different contact structures 40 from among the contact structures 40. This results in a purposefully inhomogeneous brightness distribution.

A conductor track structure (not illustrated in FIG. 2) can be formed between the adhesion medium layer 36 and the encapsulation layer 24, and/or between the adhesion medium layer 36 and the contact structures 40, via which conductor track structure the contact structures 40 are electrically contactable. By way of example, the conductor track structure can be electrically coupled to an electronic circuit (not illustrated), for example a control and/or regulating unit.

FIG. 3 shows a plan view of one embodiment of an optoelectronic component 10, for example of the optoelectronic component 10 explained above with reference to FIG. 2.

FIG. 3 reveals that, in this embodiment, six contact structures 40 are arranged in a manner distributed over the active region of the optoelectronic component 10. However, it is also possible for more or fewer contact structures 40 to be formed. The contact structures 40 are formed in a circular fashion. As an alternative thereto, however, the contact structures 40 can also be formed in a polygonal fashion and/or in a punctiform fashion or in a strip-shaped fashion. Furthermore, the contact structures 40 can be formed such that they intersect one another, for example such that they form a matrix, or such that they include a plurality of circular, concentric strips.

FIG. 4 shows a detailed sectional illustration of one embodiment of an optoelectronic component 10, for example in a step during a method for producing the optoelectronic component 10. The optoelectronic component 10 can for example largely correspond to the optoelectronic component 10 above. The carrier 12 is formed from an electrically conductive material, such that the first electrode 20 can be dispensed with and the carrier 12 acts as an electrode. The current flow during the operation of the optoelectronic component 10 thus takes place directly from the carrier 12 toward the optically functional layer structure 22 or from the optoelectronic layer structure 22 toward the carrier 12. In this context, the carrier 12 can be formed in a hermetically impermeable fashion and act as an encapsulation structure for the optoelectronic layer structure and/or in interaction with the encapsulation layer 24 encapsulate the optoelectronic layer structure.

The contact structure 40 is arranged and/or formed in the form of a hemispherical body on the second electrode 23. By way of example, the contact structure 40 is formed in the form of a contact point. The contact structure 40 may include for example a first contact element, a second contact element and/or a third contact element. By way of example, an electrically conductive body, for example a metal body and/or an electrically conductive paste drop, for example a silver paste drop, can form the first contact element. A second contact element can be formed for example by an adhesion medium, in particular an electrically conductive adhesion medium. By way of example, the first contact element can be secured, for example fixedly adhesively bonded or fixedly soldered, to the second electrode 23 by means of the second contact element. The encapsulation layer 24 can then be formed above the second electrode 23 and above the contact structure 40 or alongside the contact structure 40.

Figure 5:
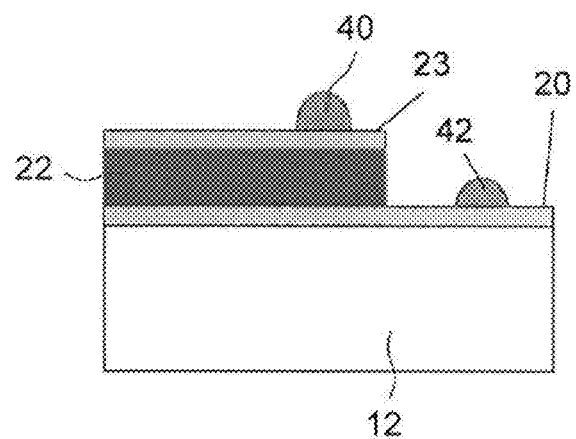
FIG. 5 shows a detailed sectional illustration of one embodiment of an optoelectronic component.

FIG. 5 shows a detailed sectional illustration of one embodiment of an optoelectronic component 10, for example in a step during a method for producing the optoelectronic component 10. The optoelectronic component 10 can for example largely correspond to one of the optoelectronic components 10 explained above. By way of example, the optoelectronic component 10 may include the first electrode 20 between the carrier 12 and the optically functional layer structure 22. Furthermore, the optoelectronic component 10 may include the contact structure 40 for electrically contacting the second electrode 23. Furthermore, the optoelectronic component 10 includes a further contact structure 42 for electrically contacting the first electrode 20.

The further contact structure 42 can be formed for example in accordance with one configuration of the first contact structure 40. In particular, the further contact structure 42 may include further contact elements or be formed thereby. The further contact structure 42 can serve for example for simple and/or secure contacting of the first electrode 20. By way of example, the further contact structure 42 can protect the first electrode 20 against mechanical damage during the electrical contacting of said first electrode.

The encapsulation layer 24 can then be formed above the second electrode 23 and above or alongside the contact structure 40 or the further contact structure 42.

Figure 6:
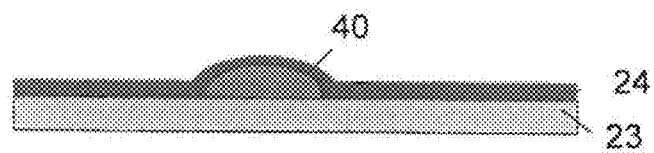
FIG. 6 shows a detailed sectional illustration of embodiments of an electrode, of an encapsulation layer and of a contact structure during a method for producing an optoelectronic component.

FIG. 6 shows a detailed sectional illustration of embodiments of the second electrode 23, the contact structure 40 and the encapsulation layer 24 during a step of a method for producing the optoelectronic component 10. The second electrode 23, the contact structure 40 and/or the encapsulation layer 24 can be formed for example in accordance with the second electrode 23, contact structure 40 and/or encapsulation layer 24 explained above. FIG. 6 shows, in particular, a state in which the first contact structure 40 is completely covered by the encapsulation layer 24, for example directly after the process of forming the encapsulation layer 24.

Forming the contact structure 40 in such a way that the contact structure 40 is permanently durable and/or resistant may require warming and/or heating the contact structure 40, depending on the material used for the contact structure 40. Warming and/or heating can be effected for example simultaneously in the course of applying the encapsulation layer 24 if applying the encapsulation layer 24 is effected at elevated temperature. If the encapsulation layer 24 is formed by means of a CVD method, for example, then in this case the contact structure 40 can be heated in such a way that it hardens and/or dries.

In a direction perpendicular to the surface of the second electrode 23 on which the contact structure 40 is formed, the contact structure 40 has a larger thickness than the encapsulation layer 24, for example than the encapsulation layer 24 outside the contact structure 40. This can contribute for example to producing the electrical connection to the second electrode 23 in a simple manner, for example by the encapsulation layer 24 being removed above the contact structure 40, for example in a grinding, scratching, ablation or etching process. Furthermore, this can contribute to protecting the second electrode 23 against mechanical damage, in particular during the electrical contacting of the contact structure 40. If the further contact structure 42 is arranged, then it can be formed in accordance with one configuration of the contact structure 40. The contact structure 40 and the further contact structure 42 can be formed identically or differently.

Figure 7:
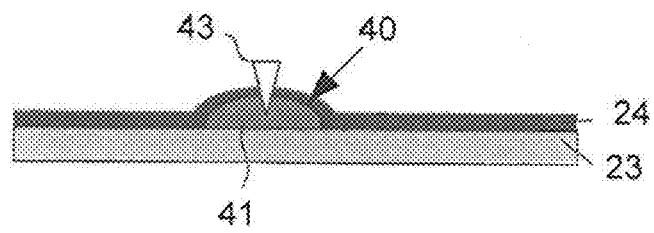
FIG. 7 shows a detailed sectional illustration of embodiments of an electrode, of an encapsulation layer and of a contact structure during the method for producing an optoelectronic component.

FIG. 7 shows a further state of the second electrode 23, the contact structure 40 and the encapsulation layer 24 during the method for producing the optoelectronic component 10, in which the contact structure 40 includes a first contact element 41, which is formed directly on the second electrode 23, and a further contact element, for example a third contact element 43. The third contact element 43 was moved through the encapsulation layer 24 until it is in direct physical contact with the first contact element 41. The third contact element 43 is formed for example in a thorn-shaped fashion or in a needle-shaped fashion and has pierced the encapsulation layer 42. As a result, a cutout is formed in the encapsulation layer 24. The third contact element 43 can then remain in place for the purpose of electrical contacting, and the electrical contacting can be effected via the first contact element 41 and the third contact element 43. As an alternative thereto, the third contact element 43 can be removed again and the cutout then remaining in the encapsulation layer 24 can subsequently be filled with an electrically conductive material, wherein the electrically conductive material can then form the third contact element 43.

In other words, a needle contacting can be effected in which the encapsulation layer 24 is pierced by a needle, wherein the needle can be removed or can be used as third contact element 43 of the contact structure 40. If the needle is removed after piercing the encapsulation layer 24, then the resulting cutout can be filled by the third contact element 43. During the needle contacting, the first contact element 41 serves as protection of the second electrode 23 and of the underlying optically functional layer structure 22 against the needle. Consequently, the contact structure 40 enables the needle contacting, wherein the second electrode 23 and the underlying optically functional layer structure 22 are not damaged in the process.

Figure 8:
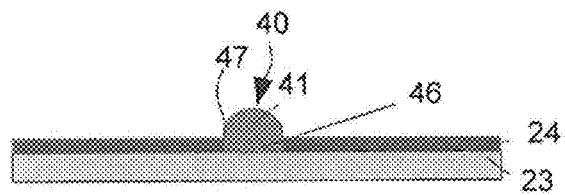
FIG. 8 shows a detailed sectional illustration of embodiments of an electrode, of an encapsulation layer and of a contact structure during the method for producing an optoelectronic component.

FIG. 8 shows a detailed sectional illustration of embodiments of the second electrode 23, the contact structure 40 and the encapsulation layer 24, for example during the method for producing the optoelectronic component 10.

The contact structure 40 projects from the encapsulation layer 24 and has a larger thickness than the encapsulation layer 24. Optionally, the second contact element 46 can be arranged, in particular the adhesion medium by means of which the contact structure 40, in particular the first contact element 41, is fixed to the second electrode 23.

Beforehand, the contact structure 40 can be arranged on the second electrode 23. By way of example, the second contact element 46 can be arranged on the second electrode 23 and the first contact element 41 can be arranged on the second contact element 46. As an alternative thereto, the first contact element 41 can be arranged directly on the second electrode 23. The encapsulation layer 24 can be processed for example such that it is removed above the contact structure 40. In other words, the contact structure 40 can be at least partly exposed and/or at least partly freed of the encapsulation structure 24. As an alternative thereto, firstly a cutout 47 can be formed in the encapsulation layer 24, for example by means of a laser and/or by means of an etching method. The contact structure 40 can then be arranged and/or formed in the cutout 47 on the second electrode 23.

Figure 9:
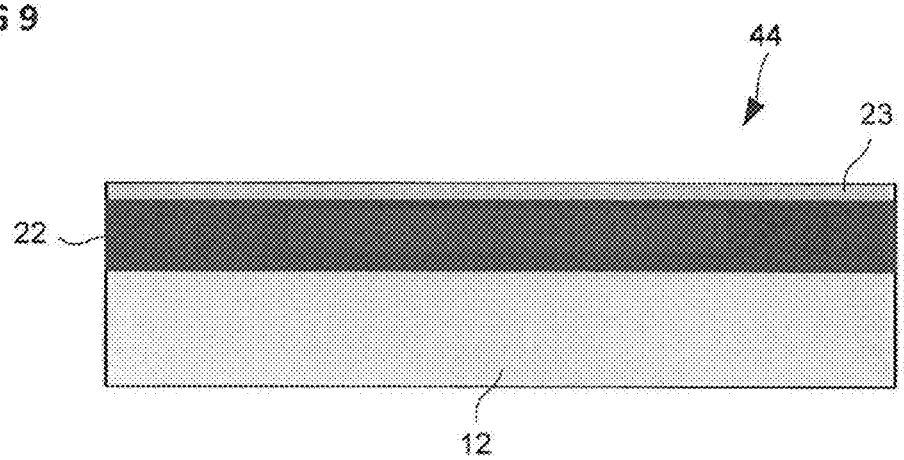
FIG. 9 shows a first state of one embodiment of a component assemblage during a method for producing an optoelectronic component.

FIG. 9 shows one embodiment of a component assemblage 44 in a first state during a method for producing an optoelectronic component 10. The component assemblage 44 is suitable for producing a plurality of optoelectronic components 10. The component assemblage 44 includes the carrier 12, which can correspond for example to the carrier 12 explained above, wherein the carrier 12 is suitable for forming a plurality of optoelectronic components 10. The carrier 12 can thus form a carrier assemblage. The carrier assemblage can be for example a semiconductor substrate. The optically functional layer structure 22 is formed on the carrier 12. Optionally, the first electrode 20 can be formed between the carrier 12 and the optically functional layer structure 22. The optically functional layer structure 22 extends in a manner corresponding to the carrier 12 over a plurality of optoelectronic components 10 to be produced. The second electrode 23 is formed above the optically functional layer structure 22. The second electrode 23 extends in a manner corresponding to the carrier 12 and the optically functional layer structure 22 across a plurality of optoelectronic components 10 to be produced.

Figure 10:
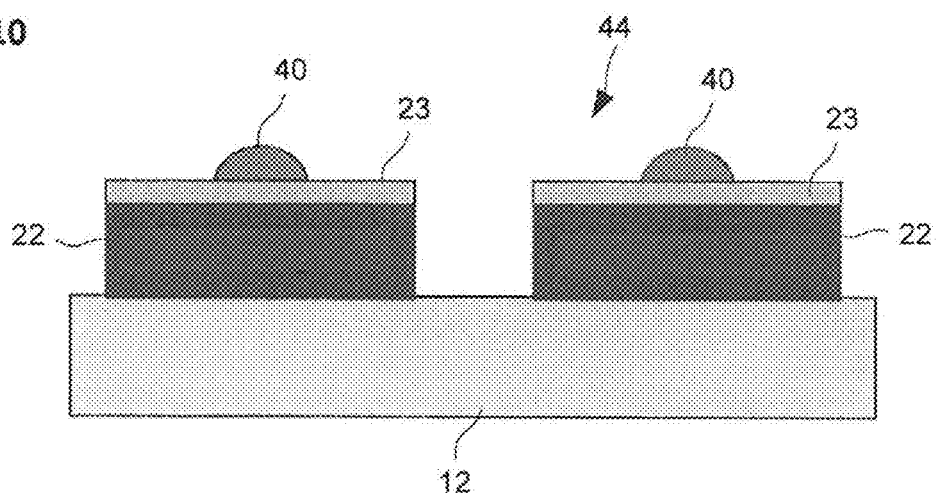
FIG. 10 shows a second state of the component assemblage during the method for producing the optoelectronic component.

FIG. 10 shows a second state of the component assemblage 44 during the method for producing the optoelectronic component 10. In the component assemblage 44, the optically functional layer structures 22 for respectively an optoelectronic component 10 are separated from one another and the contact structures 40 are formed on the corresponding second electrodes 23. The contact structures 40 can be formed on the second electrode 23 before the separation of the optically functional layer structures 22 or after the separation of the optically functional layer structures 22.

Figure 11:
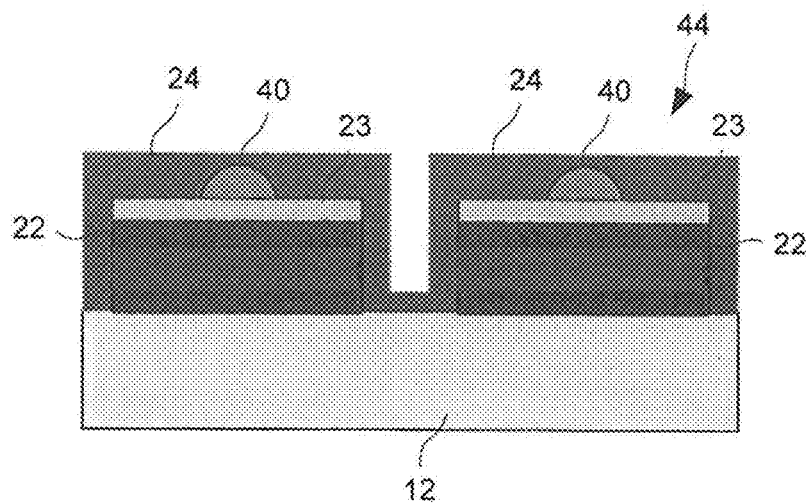
FIG. 11 shows a third state of the component assemblage during the method for producing the optoelectronic component.

FIG. 11 shows a third state of the component assemblage 44 during the method for producing the optoelectronic components 10, in which the encapsulation layer 24 is formed above the optically functional layer structures 22, the second electrodes 23 and the contact structures 40. The encapsulation layer 24 encapsulates the optically functional layer structures 22, the second electrodes 23 and the contact structures 40. In particular, the encapsulation layer 24 encapsulates the optically functional layer structures 22, the second electrodes 23 and the contact structures 40 in interaction with the carrier 12.

Figure 12:
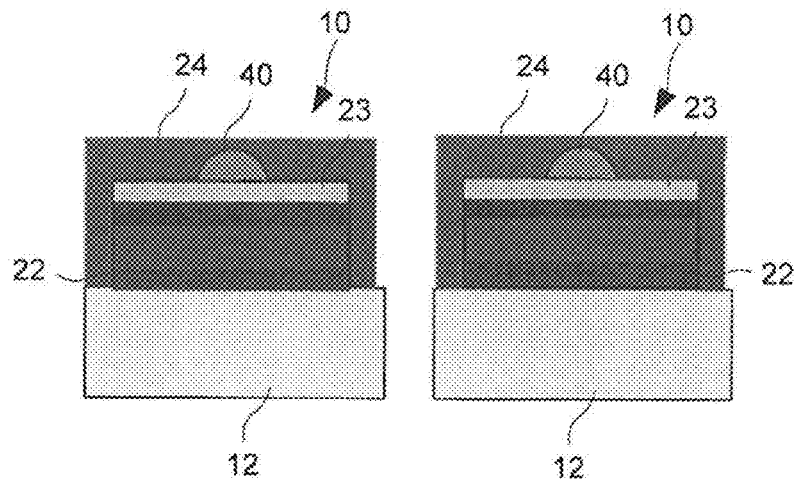
FIG. 12 shows embodiments of optoelectronic components during the method for producing the optoelectronic component.

FIG. 12 shows two embodiments of optoelectronic components 10 which were singulated for example from the component assemblage 44 shown in FIG. 11. The contact structures 40 can subsequently be at least partly freed of the encapsulation layer 24. By way of example, the contact structures 40 can be exposed in the encapsulation layer 24. By way of example, the encapsulation layer 24 can be removed locally or above the entire optoelectronic component 10 to an extent such that the contact structures 40 project from the encapsulation layer 24. As an alternative thereto, it is possible to drill through the encapsulation layers 24, for example by means of the third contact elements 43 of the contact structures 40 as explained with reference to FIG. 7.

Singulating the optoelectronic components 10 can be effected for example mechanically by means of cutting, sawing or stamping and/or by means of a laser.

Figure 13:
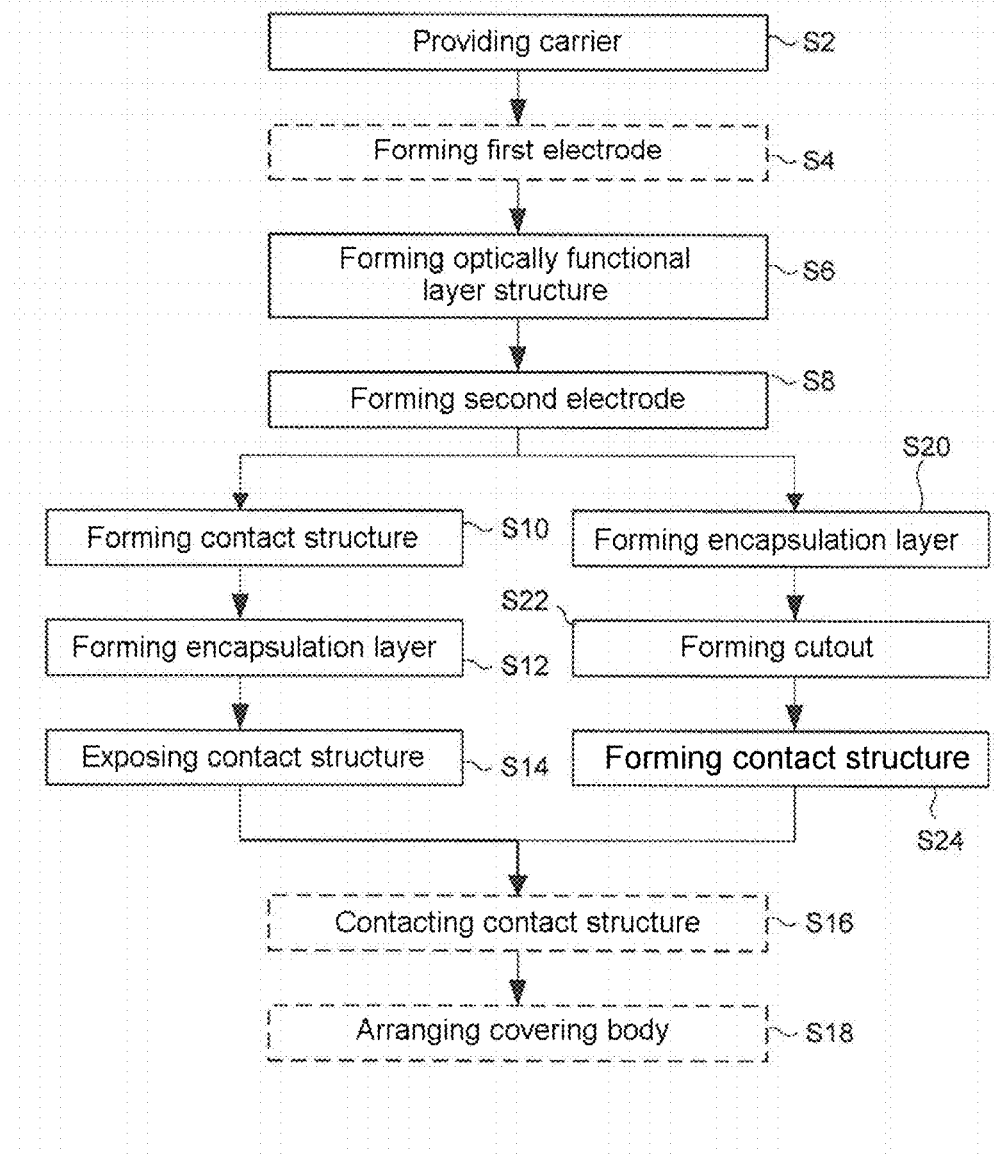
FIG. 13 shows a flow diagram of one embodiment of a method for producing an optoelectronic component.

FIG. 13 shows a flow diagram of one embodiment of a method for producing an optoelectronic component, for example one of the optoelectronic components 10 explained above. The method serves for producing the optoelectronic component 10 simply and/or cost-effectively.

A step S2 involves providing a carrier, for example the carrier 12 explained above, for example as an individual carrier for one optoelectronic component 10 or as a carrier assemblage for a plurality of optoelectronic components 10.

A step S4 can involve optionally forming a first electrode, for example the first electrode 20 explained above.

A step S6 involves forming an optically functional layer structure, for example the optically functional layer structure 22 explained above. The optically functional layer structure 22 may include a plurality of partial layers, for example optically functional layer structure units, which can be formed successively and/or one above another, as explained in greater detail below with reference to FIG. 15.

A step S8 involves forming a second electrode, for example the second electrode 23. The second electrode 23 is formed above the optically functional layer structure 22.

A step S10 involves forming a contact structure, for example the contact structure 40 explained above. The contact structure 40 is formed above the second electrode 23, for example directly on the second electrode 23.

A step S12 involves forming an encapsulation layer, for example the encapsulation layer 24 explained above. The encapsulation layer 24 is formed above the contact structure 40 and the second electrode 23.

A step S14 involves at least partly exposing the contact structure 40 and/or freeing it of the encapsulation layer 24. By way of example, the encapsulation layer 24 can be partly or completely removed above the contact structure 40.

Optionally, a step S16 can involve contacting the contact structure 40, for example by means of the conductor track structure explained above.

A step S18 can involve arranging a covering body, for example the covering body 38 explained above. The covering body 38 can be arranged on the encapsulation layer 24 for example with the aid of an adhesion medium, for example by means of the adhesion medium layer 36.

As an alternative to steps S10, S12 and S14, it is possible to form steps S20, S22 and S24.

Step S20 involves forming an encapsulation layer on the second electrode 23, for example the encapsulation layer 24 explained above.

A step S22 involves forming a cutout in the encapsulation layer 24, for example the cutout 47 explained above. The cutout 47 can be formed for example by means of an etching method or a laser removal method, for example a laser ablation method.

A step S24 involves forming a contact structure, for example the contact structure 40 explained above. The contact structure 40 is formed in the cutout 47 on the second electrode 23. The method can subsequently be continued in step S16 and/or step S18.

The optoelectronic component 10 can be produced for example in an assemblage with many optoelectronic components 10, for example optoelectronic components 10 of identical type, for example in a wafer assemblage. The optoelectronic components 10 can subsequently be singulated from the assemblage, for example by means of mechanical singulation, by means of cutting, sawing, stamping, and/or by means of a laser.

Figure 14:
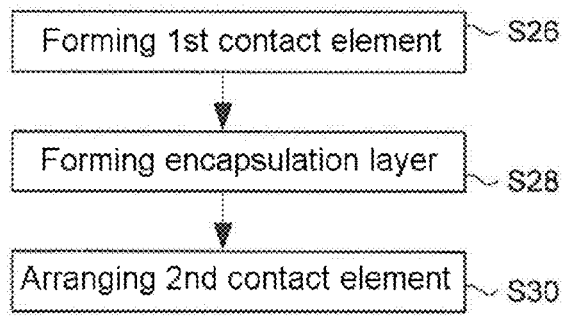
FIG. 14 shows a flow diagram of one embodiment of a part of a method for producing an optoelectronic component.

FIG. 14 shows a flow diagram of one embodiment of a partial method for producing an optoelectronic component. By way of example, steps S26, S28 and S30 shown in FIG. 14 can be processed instead of steps S10, S12 and S14, respectively, or instead of steps S20, S22 and S24, respectively, in the course of the method explained above.

Step S26 involves forming a first contact element on the second electrode section, for example the first contact element 41.

Step S28 involves forming the encapsulation layer 24 above the second electrode 23 and the first contact element 41.

Step S30 involves arranging a third contact element, for example the third contact element 43. The third contact element 43 is arranged in such a way that it extends through the encapsulation layer 24 and thereby forms an electrically conductive, for example galvanic, connection through the encapsulation layer 24 to the second electrode 23. By way of example, it is possible to drill through or pierce the encapsulation layer 24 by means of the third contact element 43, or it is possible firstly to drill through or pierce the encapsulation layer 24 and it is then possible to arrange the third contact element 43. The contact structure 40 is thus formed in such a way that it forms an electrical connection through the encapsulation layer 24.

Figure 15:
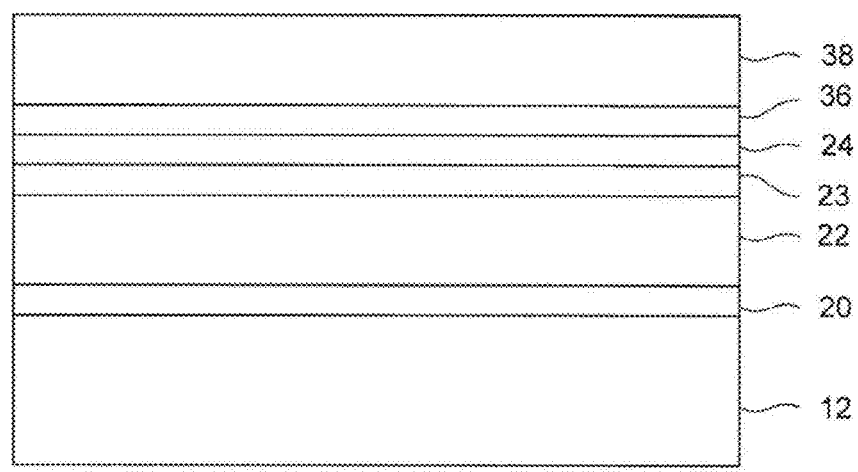
FIG. 15 shows a detailed sectional illustration of one embodiment of a layer structure of an optoelectronic component.

FIG. 15 shows a detailed sectional illustration of a layer structure of one embodiment of an optoelectronic component, for example of the optoelectronic component 10, the contact structure 40 not being illustrated in this detail view. The optoelectronic component 10 can be formed as a top emitter and/or bottom emitter. If the optoelectronic component 10 is formed as a top emitter and bottom emitter, the optoelectronic component 10 can be referred to as an optically transparent component, for example a transparent organic light emitting diode.

The optoelectronic component 10 includes the carrier 12 and the active region above the carrier 12. A first barrier layer (not illustrated), for example a first barrier thin-film layer, can be formed between the carrier 12 and the active region. An insulation layer and/or a planarization layer can be formed between the carrier 12 and the barrier layer. If, for example, a surface of the carrier 12 is too rough for forming the first electrode 20, then the planarization layer can be formed on the carrier 12. If, for example, the carrier is formed in an electrically conductive fashion, then the insulation layer can be formed, for example, in order to electrically insulate the first electrode 20 from the carrier 12. Optionally, a single layer having the dual function of planarization and insulation can be formed. Furthermore, the corresponding layer can be structured laterally, that is to say parallel to the other layers. The active region includes the first electrode 20, the optically functional layer structure 22 and the second electrode 23. The encapsulation layer 24 is formed above the active region. The encapsulation layer 24 can be formed as a second barrier layer, for example as a second barrier thin-film layer. The cover 38 is arranged above the active region and, if appropriate, above the encapsulation layer 24. The cover 38 can be arranged on the encapsulation layer 24 by means of an adhesion medium layer 36, for example.

The active region is an electrically and/or optically active region. The active region is, for example, that region of the optoelectronic component 10 in which electric current for the operation of the optoelectronic component 10 flows and/or in which electromagnetic radiation is generated or absorbed. That part of the second electrode 23 which is arranged above the active region can also be designated as the functional part of the second electrode 23.

The optically functional layer structure 22 may include one, two or more functional layer structure units and one, two or more intermediate layers between the layer structure units.

The carrier 12 can be formed as translucent or transparent. The carrier 12 serves as a carrier element for electronic elements or layers, for example light emitting elements. The carrier 12 may include or be formed from, for example, glass, quartz, and/or a semiconductor material or any other suitable material. Furthermore, the carrier 12 may include or be formed from a plastics film or a laminate including one or including a plurality of plastics films. The plastic may include one or a plurality of polyolefins. Furthermore, the plastic may include polyvinyl chloride (PVC), polystyrene (PS), polyester and/or polycarbonate (PC), polyethylene terephthalate (PET), polyethersulfone (PES) and/or polyethylene naphthalate (PEN). The carrier 12 may include or be formed from a metal, for example copper, silver, gold, platinum, iron, for example a metal compound, for example steel. The carrier 12 can be formed as a metal film or metal-coated film. The carrier 12 can be a part of a mirror structure or form the latter. The carrier 12 can have a mechanically rigid region and/or a mechanically flexible region or be formed in this way.

The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality of layers including metals or TCOs. The first electrode 20 may include for example a layer stack of a combination of a layer of a metal on a layer of a TCO, or vice versa. One example is a silver layer applied on an indium tin oxide (ITO) layer (Ag on ITO) or ITO-Ag-ITO multilayers.

By way of example, Ag, Pt, Au, Mg, Al, Ba, In, Ca, Sm or Li, and compounds, combinations or alloys of these materials can be used as metal.

Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs.

The first electrode 20 may include, as an alternative or in addition to the materials mentioned: networks composed of metallic nanowires and nanoparticles, for example composed of Ag, networks composed of carbon nanotubes, graphene particles and graphene layers and/or networks composed of semiconducting nanowires. Alternatively or additionally, the first electrode 20 may include or be formed from one of the following structures: a network composed of metallic nanowires, for example composed of Ag, which are combined with conductive polymers, a network composed of carbon nanotubes which are combined with conductive polymers, and/or graphene layers and composites. Furthermore, the first electrode 20 may include electrically conductive polymers or transition metal oxides.

The first electrode 20 can have for example a layer thickness in a range of 10 nm to 500 nm, for example of less than 25 nm to 250 nm, for example of 50 nm to 100 nm.

The first electrode 20 can be electrically coupled to a first electrical terminal, for example the first contact section 16, to which a first electrical potential can be applied. The first electrical potential can be provided by an energy source (not illustrated), for example by a current source or a voltage source. Alternatively, the first electrical potential can be applied to the carrier 12 and the first electrode 20 can be supplied indirectly via the carrier 12. The first electrical potential can be for example the ground potential or some other predefined reference potential.

The optically functional layer structure 22 may include a hole injection layer, a hole transport layer, an emitter layer, an electron transport layer and/or an electron injection layer.

The hole injection layer can be formed on or above the first electrode 20. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N, N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di [4-(N,N-ditolylamino)phenyl] cyclohexane; 2,2',7,7'-tetra(N,N-ditolyl) aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

The hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolyl-amino)phenyl] cyclohexane; 2,2',7,7'-tetra(N,N-ditolyl) aminospirobifluorene; and N,N,N',N'-tetranaphthalen-2-ylbenzidine.

The hole transport layer can have a layer thickness in a range of approximately 5 nm to approximately 50 nm, for example in a range of approximately 10 nm to approximately 30 nm, for example approximately 20 nm.

The one or a plurality of emitter layers, for example including fluorescent and/or phosphorescent emitters, can be formed on or above the hole transport layer. The emitter layer may include organic polymers, organic oligomers, organic monomers, organic small, non-polymeric molecules ("small molecules") or a combination of these materials. The emitter layer may include or be formed from one or a plurality of the following materials: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine] ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 ((4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method. The emitter materials can be embedded in a suitable manner in a matrix material, for example a technical ceramic or a polymer, for example an epoxy, or a silicone.

The first emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The electron transport layer can be formed, for example deposited, on or above the emitter layer. The electron transport layer may include or be formed from one or a plurality of the following materials: NET-18; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10] phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

The electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an optically functional layer structure 22 including two or more optically functional layer structure units, corresponding intermediate layers can be formed between the optically functional layer structure units. The optically functional layer structure units can be formed in each case individually by themselves in accordance with one configuration of the optically functional layer structure 22 explained above. The intermediate layer can be formed as an intermediate electrode. The intermediate electrode can be electrically connected to an external voltage source. The external voltage source can provide a third electrical potential, for example, at the intermediate electrode. However, the intermediate electrode can also have no external electrical connection, for example by the intermediate electrode having a floating electrical potential.

The optically functional layer structure unit can have for example a layer thickness of a maximum of approximately 3 µm, for example a layer thickness of a maximum of approximately 1 µm, for example a layer thickness of a maximum of approximately 300 nm.

The optoelectronic component 10 can optionally include further functional layers, for example arranged on or above the one or the plurality of emitter layers or on or above the electron transport layer. The further functional layers can be for example internal or external coupling-in/coupling-out structures that can further improve the functionality and thus the efficiency of the optoelectronic component 10.

The second electrode 23 can be formed in accordance with one of the configurations of the first electrode 20, wherein the first electrode 20 and the second electrode 23 can be formed identically or differently. The second electrode 23 can be formed as an anode or as a cathode. The second electrode 23 can be electrically coupled to a second electrical terminal, for example the second contact section 18, to which a second electrical potential can be applied. The second electrical potential can be provided by the same energy source as, or a different energy source than, the first electrical potential. The second electrical potential can be different than the first electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation layer 24 can also be designated as thin-film encapsulation. The encapsulation layer 24 can be formed as a translucent or transparent layer. The encapsulation layer 24 forms a barrier against chemical impurities or atmospheric substances, in particular against water (moisture) and oxygen. In other words, the encapsulation layer 24 is formed in such a way that substances that can damage the optoelectronic component, for example water, oxygen or solvent, cannot penetrate through it or at most very small proportions of said substances can penetrate through it. The encapsulation layer 24 can be formed as an individual layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The encapsulation layer 24 can have a layer thickness of approximately 0.1 nm (one atomic layer) to approximately 1000 nm, for example a layer thickness of approximately 10 nm to approximately 100 nm, for example approximately 40 nm.

The encapsulation layer 24 may include a high refractive index material, for example one or a plurality of material(s) having a high refractive index, for example having a refractive index of 1.5 to 3, for example of 1.7 to 2.5, for example of 1.8 to 2.

If appropriate, the first barrier layer can be formed on the carrier 12 in a manner corresponding to one configuration of the encapsulation layer 24.

The encapsulation layer 24 can be formed for example by means of a suitable deposition method, e.g. by means of an atomic layer deposition (ALD) method, e.g. a plasma enhanced atomic layer deposition (PEALD) method or a plasmaless atomic layer deposition (PLALD) method, or by means of a chemical vapor deposition (CVD) method, e.g. a plasma enhanced chemical vapor deposition (PECVD) method or a plasmaless chemical vapor deposition (PLCVD) method, or alternatively by means of other suitable deposition methods.

If appropriate, a coupling-in or coupling-out layer can be formed for example as an external film (not illustrated) on the carrier 12 or as an internal coupling-out layer (not illustrated) in the layer cross section of the optoelectronic component 10. The coupling-in/-out layer may include a matrix and scattering centers distributed therein, wherein the average refractive index of the coupling-in/-out layer is greater than the average refractive index of the layer from which the electromagnetic radiation is provided. Furthermore, in addition, one or a plurality of antireflection layers can be formed.

The adhesion medium layer 36 may include adhesive and/or lacquer, for example, by means of which the cover 38 is arranged, for example adhesively bonded, on the encapsulation layer 24, for example. The adhesion medium layer 36 can be formed as transparent or translucent. The adhesion medium layer 36 may include for example particles which scatter electromagnetic radiation, for example light-scattering particles. As a result, the adhesion medium layer 36 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the adhesion medium layer 36, for example air bubbles, acrylate, or hollow glass beads. Furthermore, by way of example, metallic nanoparticles, metals such as gold, silver, iron nanoparticles, or the like can be provided as light-scattering particles.

The adhesion medium layer 36 can have a layer thickness of greater than 1 µm, for example a layer thickness of a plurality of µm. In various embodiments, the adhesive can be a lamination adhesive.

The adhesion medium layer 36 can have a refractive index that is less than the refractive index of the cover 38. The adhesion medium layer 36 may include for example a low refractive index adhesive such as, for example, an acrylate having a refractive index of approximately 1.3. However, the adhesion medium layer 36 can also include a high refractive index adhesive which for example includes high refractive index, non-scattering particles and has a layer-thickness-averaged refractive index that approximately corresponds to the average refractive index of the optically functional layer structure 22, for example in a range of approximately 1.6 to 2.5, for example 1.7 to approximately 2.0.

A so-called getter layer or getter structure, i.e. a laterally structured getter layer, can be arranged (not illustrated) on or above the active region. The getter layer can be formed as translucent, transparent or opaque. The getter layer may include or be formed from a material that absorbs and binds substances that are harmful to the active region. A getter layer may include or be formed from a zeolite derivative, for example. The getter layer can have a layer thickness of greater than approximately 1 µm, for example a layer thickness of a plurality of µm. In various embodiments, the getter layer may include a lamination adhesive or be embedded in the adhesion medium layer 36.

The covering body 38 can serve as encapsulation of the optoelectronic component 10 as an alternative or in addition to the encapsulation layer 24. By way of example, the encapsulation can be formed by the covering body 38 or the encapsulation can be formed by the covering body 38 and the encapsulation layer 24. The covering body 38 can be formed for example by a glass cover, a metal film or a sealed plastics film cover. By way of example, the sealing of the plastics film cover can be formed in accordance with one configuration of the encapsulation layer 24 explained above. The covering body 38 can be arranged above the encapsulation layer 24 or the active region for example by means of frit bonding (glass frit bonding/glass soldering/seal glass bonding) by means of a conventional glass solder in the geometrical edge regions of the optoelectronic component 10. In this case, the encapsulation layer 24 can be dispensed with and the covering body 38 together with the frit bonding can form the encapsulation of the optoelectronic component 10. The cover 38 can have for example a refractive index (for example at a wavelength of 633 nm) of 1.3 to 3, for example 1.4 to 2, for example 1.5 to 1.8.

Figure 16:
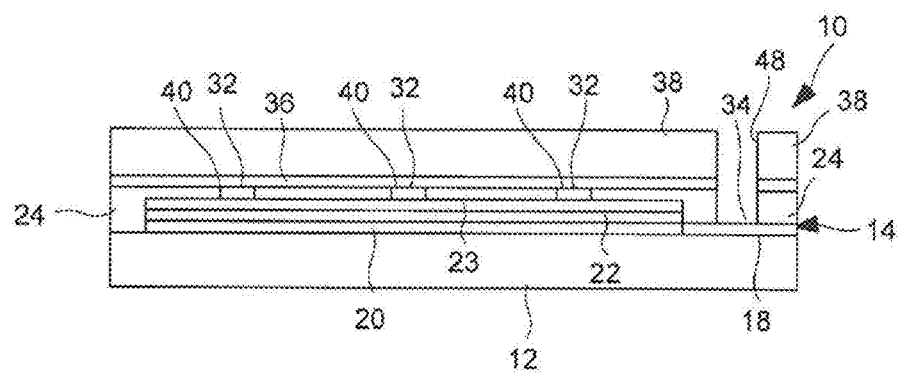
FIG. 16 shows a sectional illustration of one embodiment of an optoelectronic component.

FIG. 16 shows a sectional illustration of one embodiment of an optoelectronic component 10 which can for example largely correspond to one of the optoelectronic components 10 explained above, for example the optoelectronic component 10 explained with reference to FIG. 2. The optoelectronic component 10 includes the covering body 38, wherein the covering body 38 extends as far as a lateral outer edge of the carrier 12. By way of example, a lateral outer edge of the covering body 38 can be flush with the lateral outer edge of the carrier 12. In this context, the carrier 12 and the covering body 38 can be cut or sawn for example in a single cutting or sawing step.

The covering body 38 has a cutout, in particular a first contact cutout 48, which extends through the covering body 38 and in which the second contact region 18 is exposed and electrically contactable. The first electrode 20 is thus electrically contactable via the first contact cutout 48.

Figure 17:
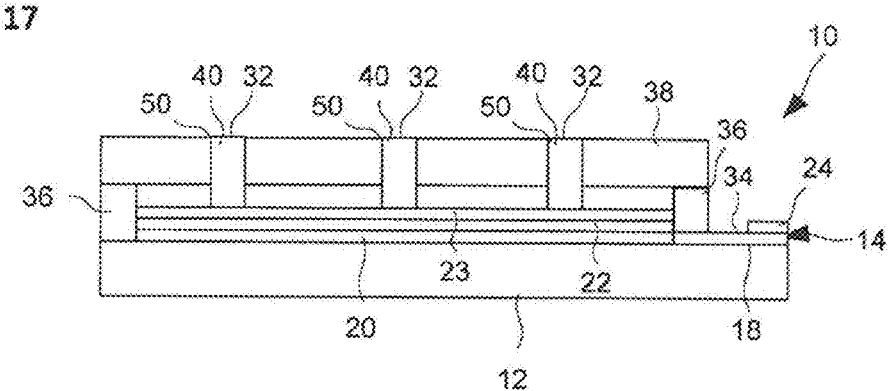
FIG. 17 shows a sectional illustration of one embodiment of an optoelectronic component.

FIG. 17 shows a sectional illustration of one embodiment of an optoelectronic component 10 which can for example largely correspond to one of the optoelectronic components 10 explained above, for example the optoelectronic component 10 explained with reference to FIG. 2. The encapsulation of the optoelectronic component is formed by the covering body 38 and the adhesion medium layer 36. The optoelectronic component 10 includes a plurality of second contact cutouts 50 of the optoelectronic component 10, which extend through the covering body 38. The contact structures 40 are formed and/or arranged in the first contact cutouts 40, to be precise in such a way that the second electrode 23 is electrically contactable via the contact structures 40 in the second contact cutouts 50.

In this embodiment, the encapsulation layer 24 can optionally be dispensed with. By way of example, the covering body 38 can be directly connected to the carrier 12 and/or the second contact section 18 by means of the adhesion medium layer 36. In this context, the adhesion medium layer 36 can be formed by a glass frit, for example, and/or the encapsulation can be designated as cavity encapsulation.

Figure 18:
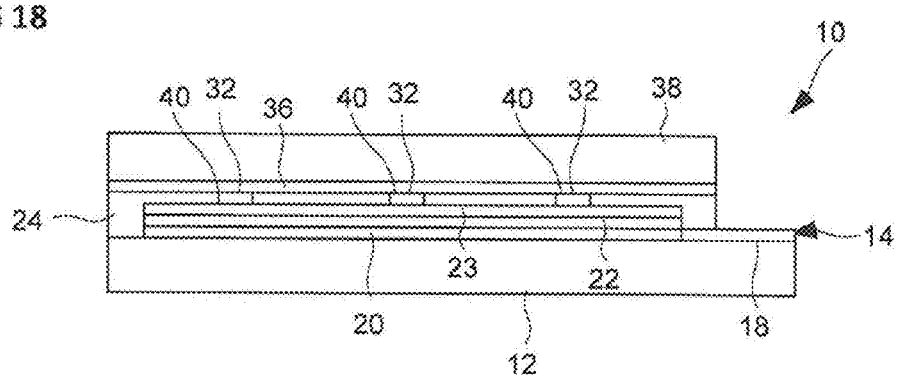
FIG. 18 shows a sectional illustration of one embodiment of an optoelectronic component.

FIG. 18 shows a sectional illustration of one embodiment of an optoelectronic component 10 which can for example largely correspond to one of the optoelectronic components 10 explained above, for example the optoelectronic component 10 explained with reference to FIG. 2. An electrical contacting of the contact structures 40 can be effected for example by the adhesion medium layer 36 being formed in an electrically conductive fashion. By way of example, the contact structures 40 can be connected to a conductor track structure and/or a wire network, around which liquid adhesive is subsequently poured. The adhesion medium layer 36 for example in a still liquid state can be connected to the covering body 38; by way of example, the covering body 38 can be laminated by means of the adhesion medium layer 36 and the adhesion medium layer 36 can subsequently be cured. The conductor track structure and the wire network can for example be electrically connected to two or more of the contact structures 40 and/or be formed in a particularly self-supporting manner. A thickness of wires of the conductor track structure and/or of the wire network can be for example in a range of 10 μm to 200 μm. The conductor track structure and/or the wire network can be directly physically connected to the rest of the optoelectronic component 10 for example exclusively at the contact structures 40; by way of example, the conductor track structure and/or the wire network can be formed so as not to touch the encapsulation layer 24. The conductor track structure and/or the wire network can be formed as an alternative or in addition to the conductor track structure above the cover.

The invention is not restricted to the embodiments specified. By way of example, in the case of the optoelectronic component 10, more or fewer of the contact structures 40 shown can be formed. Furthermore, the contact structures 40 in all the embodiments can be formed in an integral fashion, in a bipartite fashion or in a multipartite fashion. Furthermore, the contact structures 40 can have different forms than the forms shown. Furthermore, the optoelectronic components 10 may include more or fewer of the layers shown. By way of example, the optoelectronic components 10 may include diverse functional layers, for example coupling-out layers, scattering layers, focusing layers, planarization layers, etc. Furthermore, the methods shown may include more or fewer steps, particularly if correspondingly more or fewer layers are formed. Furthermore, the embodiments can be combined with one another. By way of example, each of the embodiments shown may include the optoelectronic layer structure in accordance with FIG. 15. Furthermore, both the encapsulation layer 24 and the covering body can have the cutouts, in particular the second contact cutouts 50, through which the contact structures 40 extend. Furthermore, in all the embodiments, the electrical contacting of the first electrode 20 can be effected via the first contact cutout 48 in the covering body 38 and/or, in all the embodiments, the covering body 38 can extend laterally as far as the laterally outer edges of the carrier 12.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, wherein
   a carrier is provided,
   a first electrode is formed above the carrier,
   an optically functional layer structure is formed above the first electrode,
   a second electrode is formed above the optically functional layer structure such that the second electrode extends areally over at least one part of the side of the optically functional layer structure which faces away from the carrier,
   at least one part of an electrically conductive contact structure is formed on the first electrode and/or second electrode directly above the optically functional layer structure, an encapsulation layer is formed above the first and/or second electrode and the contact structure such that the encapsulation layer encapsulates the optically functional layer structure, the first and/or second electrode and the contact structure, and the contact structure is partly freed of the encapsulation layer such that the contact structure forms an electrically conductive connection to the first and/or second electrode through the encapsulation, wherein the contact structure is formed such that the contact structure projects from the encapsulation layer after the contact structure has been freed of the encapsulation layer.

2. The method as claimed in claim 1, wherein the first and/or second electrode is encapsulated by the contact structure and the encapsulation in interaction.

3. The method as claimed in claim 1, wherein a conductor track structure is formed above the encapsulation and is electrically coupled to the contact structure.

4. The method as claimed in claim 1, wherein, above the first and/or second electrode, two, three or more of the contact structures are arranged in a distributed fashion above the first and/or second electrode.

5. The method as claimed in claim 1, wherein a plurality of optoelectronic components are produced in the component assemblage, wherein the carrier extends over a plurality of the optoelectronic components, the optically functional layer structures, the electrodes, the contact structures and the encapsulations of the optoelectronic components are formed in the component assemblage and the optoelectronic components are subsequently singulated.

6. A method for producing an optoelectronic component, wherein a carrier is provided, a first electrode is formed above the carrier, an optically functional layer structure is formed above the first electrode, a second electrode is formed above the optically functional layer structure such that the second electrode extends areally over at least one part of the side of the optically functional layer structure which faces away from the carrier, at least one part of an electrically conductive contact structure is formed on the first and/or second electrode by virtue of a first contact element of the contact structure being formed on the first and/or second electrode, an encapsulation layer is formed above the first and/or second electrode and the contact structure such that the encapsulation layer encapsulates the optically functional layer structure, the first and/or second electrode and the contact structure, and a further contact element of the contact structure is moved through the encapsulation layer such that the further contact element pierces the encapsulation layer until the further contact element physically and electrically contacts the first contact element, such that the contact structure forms an electrically conductive connection through the encapsulation layer.

\* \* \* \* \*